(12) United States Patent
Tai

(10) Patent No.: US 7,786,604 B2
(45) Date of Patent: Aug. 31, 2010

(54) DUAL MOSFET PACKAGE

(75) Inventor: Liang-Pin Tai, Tainan (TW)

(73) Assignee: Richtek Technology Corp., Hsinchu (TW)

(*) Notice: Subject to any disclaimer, the term of this patent is extended or adjusted under 35 U.S.C. 154(b) by 303 days.

(21) Appl. No.: 11/797,779

(22) Filed: May 8, 2007

(65) Prior Publication Data
US 2007/0267742 A1 Nov. 22, 2007

(30) Foreign Application Priority Data
May 19, 2006 (TW) ................. 95117894 A

(51) Int. Cl.
*H01L 23/34* (2006.01)

(52) U.S. Cl. ............ 257/784; 257/342; 257/343; 257/401; 257/685; 257/686; 257/687; 257/E23.02; 257/E23.043

(58) Field of Classification Search ............ 257/342, 257/343, 401, 686, 687, 685, 784, 786, E23.03, 257/E23.043
See application file for complete search history.

(56) References Cited

U.S. PATENT DOCUMENTS

| | | | |
|---|---|---|---|
| 6,184,585 B1* | 2/2001 | Martinez et al. | 257/777 |
| 6,448,643 B2* | 9/2002 | Cheah et al. | 257/723 |
| 2003/0075796 A1* | 4/2003 | Hata et al. | 257/734 |
| 2004/0227547 A1* | 11/2004 | Shiraishi et al. | 327/110 |

OTHER PUBLICATIONS

S. Clark, IC Package Design's Effects on Signal Integrity, DesignCon 2003, High-Performance System Design, 2003.*

* cited by examiner

*Primary Examiner*—Eugene Lee
*Assistant Examiner*—Peniel M Gumedzoe
(74) *Attorney, Agent, or Firm*—Rosenberg Klein & Lee

(57) ABSTRACT

A semiconductor device package comprises a first semiconductor die having a first source region, a first gate region, and a first drain region attached on a first leadframe, a second semiconductor die having a second source region, a second gate region, and a second drain region attached on a second leadframe, and several pins electrically connected to the leadframes and source and gate regions. The second leadframe is electrically connected to the first source region. The pins connected to the first leadframe and second source region are on a side of the package, and the pins connected to the first gate region, second leadframe, and second gate region are on another side of the package.

18 Claims, 12 Drawing Sheets

_US 7,786,604 B2_

DUAL MOSFET PACKAGE

FIELD OF THE INVENTION

The present invention is generally related to a semiconductor device package and, more particularly, to a dual MOSFET package.

BACKGROUND OF THE INVENTION

FIG. 1 shows a synchronous buck converter 10, in which a transistor M1 is connected between a power input VIN and a phase node PH, a transistor M2 is connected between the phase node PH and ground GND, and a controller 12 provides control signals UG and LG to switch the transistors M1 and M2 so as to generate an inductor current I flowing through an inductor L to charge a capacitor Co to produce an output voltage VOUT. In the traditional synchronous buck converter 10, the transistors M1 and M2 for serving as power switches are packaged in two individual packages, respectively, and therefore need much space. In order to reduce the needed space, it has been proposed to package the two transistors M1 and M2 in a single package.

FIG. 2 shows a traditional dual SO-8 MOSFET package 20, in which the drain D1 of the MOS transistor M1 is connected to the pins 5 and 6, the source S1 of the MOS transistor M1 is connected to the pin 3, the gate G1 of the MOS transistor M1 is connected to the pin 4, the drain D2 of the MOS transistor M2 is connected to the pins 7 and 8, the source S2 of the MOS transistor M2 is connected to the pin 1, the gate G2 of the MOS transistor M2 is connected to the pin 2, and a plastic body 21 encapsulates the transistors M1 and M2. FIG. 3 shows a top perspective view of the SO-8 package 20 shown in FIG. 2, there are eight pins in this package 20, and a recess 22 on the top of the package 20 to indicate the position of the pin 1, FIG. 4 shows a layout when the package 20 is used in a synchronous buck converter, in which the pin 1 of the package 20 is connected to ground GND by a wire 24, the pin 2 of the package 20 is connected with the control signal LG by a wire 26, the pin 3 of the package 20 is connected to the pins 7 and 8 of the package 20 by a wire 28, the pin 4 of the package 20 is connected with the control signal UG by a wire 30, and the pins 5 and 6 of the package 20 are connected to the power input VIN by a wire 32. Although the transistors M1 and M2 are integrated in the single package 20 to reduce the needed space, it brought more inconvenience and difficulty in the layout of the printed circuit board (PCB). For example, the wire 28 needs across over the two wires 24 and 26 to connect the source S1 of the transistor M1 to the drain D2 of the transistor M2.

In order to reduce the difficulty in the PCB layout, FairChild Semiconductor Corporation has developed two dual SO-8 MOSFET packages, with the product numbers FD6900AS and FD6986AS. In addition, International Rectifier (IR) Corporation also has developed a dual SO-8 MOSFET package, with the product number IRF7094. In these packages, the connection between the source S1 of the transistor M1 and the drain D of the transistor M2 is within the packages.

FIG. 5 shows a layout when a FairChild FD6900AS is used in a synchronous buck converter. In the package 40, the drain D1 of the transistor M1 is connected to the power input VIN via the pins 1 and 2, the source S1 of the transistor M1 is connected to the inductor L via the pins 5, 6 and 7, the gate G1 of the transistor M1 is connected with the control signal UG via the pin 8, the connection between the drain D2 of the transistor M2 and the source S1 of the transistor M1 is within the package 40, the source S2 of the transistor M2 is grounded via the pin 4, the gate G2 of the transistor M2 is connected with the control signal LG via the pin 3, and a plastic body 42 encapsulates the transistors M1 and M2.

FIG. 6 shows a layout when a FairChild FD6986AS is used in a synchronous buck converter. In the package 50, the drain D1 of the transistor M1 is connected to the power input VIN via the pins 7 and 8, the source S1 of the transistor M1 is connected to the inductor L via the pins 1, 5 and 6, the gate G1 of the transistor M1 is connected with the control signal UG via the pin 2, the connection between the drain D2 of the transistor M2 and the source S1 of the transistor M1 is within the package 50, the source S2 of the transistor M2 is grounded via the pin 3, the gate G2 of the transistor M2 is connected with the control signal LG via the pin 4, and a plastic body 52 encapsulates the transistors M1 and M2.

FIG. 7 shows a layout when an IRF7094 is used in a synchronous buck converter. In the package 60, the drain D1 of the transistor M1 is connected to the power input VIN via the pin 8, the source S1 of the transistor M1 is connected to the inductor L via the pins 5, 6 and 7, the gate G1 of the transistor M1 is connected with the control signal UG via the pin 1, the connection between the drain D2 of the transistor M2 and the source S1 of the transistor M1 is within the package 60, the source S2 of the transistor M2 is grounded via the pins 2 and 3, the gate G2 of the transistor M2 is connected with the control signal LG via the pin 4, and a plastic body 62 encapsulates the transistors M1 and M2.

In the PCB layout, however, these packages 40, 50 and 60 still bring disadvantages. For example, when using the package 40, the wire (from the pin 3) for the gate G2 of the transistor M2 to connect with the control signal LG needs across over another wire; and when using the package 50, the wire (from the pin 2) for the gate G1 of the transistor M1 to connect with the control signal UG needs across over another wire. When using the package 60, the pin 8 which is connected to the power supply VIN isn't on the same side of the package 60 as that for the pins 2 and 3 which are connected to ground GND, and therefore the cathode of the input capacitor Cin which is connected to the power input VIN needs across over another wire to connect to ground GND, increasing the difficulty for the layout. An alternative solution to avoid such layout issue is to add a through hole in the PCB for the cathode of the input capacitor Cin to connect to the ground plane on the back surface of the PCB via the through hole. However, such approach will reduce the decoupling capability of the input capacitor Cin.

On the other hand, when a dual MOSFET package is operating, heat will be generated on the I/O terminals of the transistors M1 and M2 within the package. Most of the heat will be transferred to the PCB through the pins which are connected to the terminals of the transistors M1 and M2, and then dissipated to the air from the PCB. Unfortunately, in a traditional dual MOSFET package, the connections between the terminals of the transistors M1 and M2 and the pins are implemented by bonding wires which are very thin, and therefore the heat on some of the terminals which have higher heat density cannot be quickly transferred to the PCB. For example, the drain D1 which is connected to the power input VIN and the source S1 and drain D2 which output the inductor current I cannot quickly transfer the heat thereon to the pins they are connected to for further dissipating to the PCB. As a result, the dual MOSFET package connot be applied to some devices which need larger inductor current, for example motherboard, due to the poor thermal dissipation of the package.

Therefore, a dual MOSFET package convenient for layout and advantageous for thermal dissipation is desired.

SUMMARY OF THE INVENTION

An object of the present invention is to provide a dual MOSFET package which is more convenient for layout.

Another object of the present invention is to provide a dual MOSFET package which has better thermal dissipation.

A dual MOSFET package according to the present invention comprises a first semiconductor die having a first drain region attached on a first leadframe, and a second semiconductor die having a second drain region attached on a second leadframe. The second leadframe is electrically insulated from the first leadframe and electrically connected to a first source region on the first semiconductor die. A first pin is electrically connected to the first leadframe. A second pin is electrically connected to a first gate region on the first semiconductor die. A third pin is electrically connected to the second leadframe. A fourth pin is electrically connected to a second source region on the second semiconductor die. A fifth pin is electrically connected to a second gate region on the second semiconductor die. The first and fourth pin are on a first side of the package, and the second, third and fifth pin are on a second side of the package.

To enhance the heat dissipation of the package, each of the first and second leadframe may have a surface exposed to outside of the package for thermally connecting to a PCB. In addition, each of the first and third pin may be stretched from the respective leadframe, such that the heat at the first and second drain region are quickly transferred through the first and third pin to the PCB.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
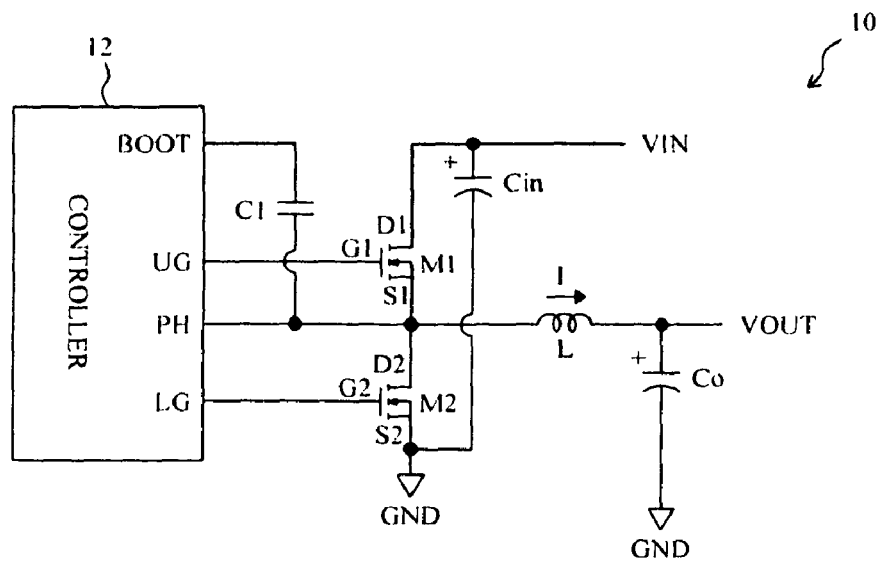
FIG. 1 shows a circuit diagram of a synchronous buck converter.
Figure 2:
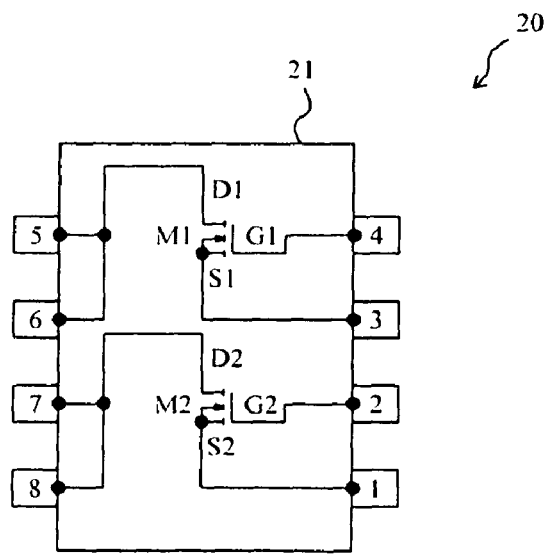
FIG. 2 shows an internal arrangement of a traditional dual SO-8 MOSFET package.
Figure 3:
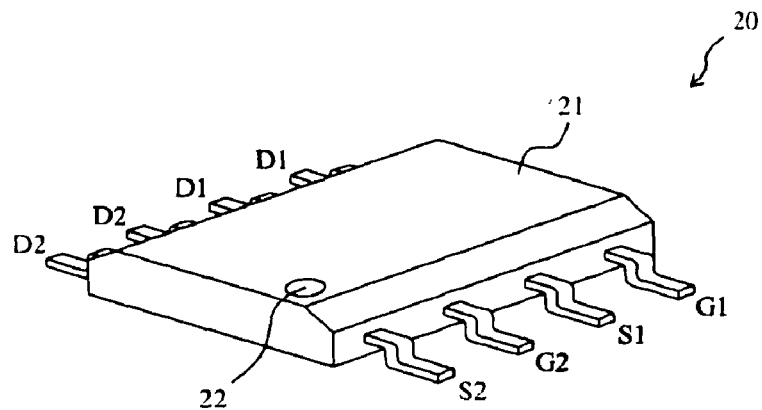
FIG. 3 shows a top perspective view of the SO-8 package shown in FIG. 2.
Figure 4:
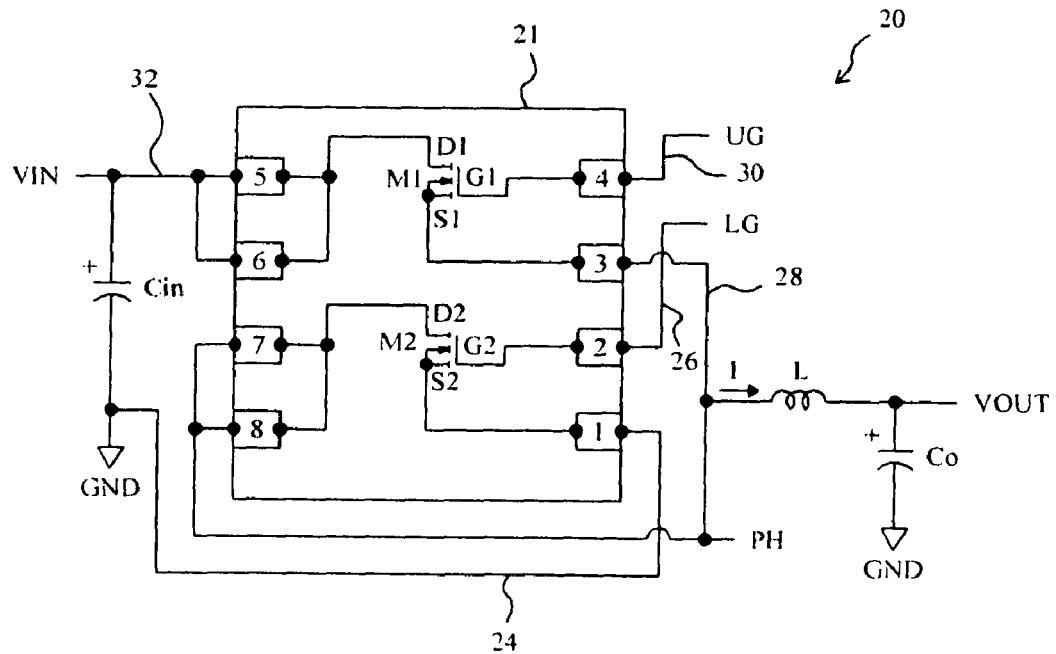
FIG. 4 shows a layout when the package of FIG. 2 is used in a synchronous buck converter.
Figure 5:
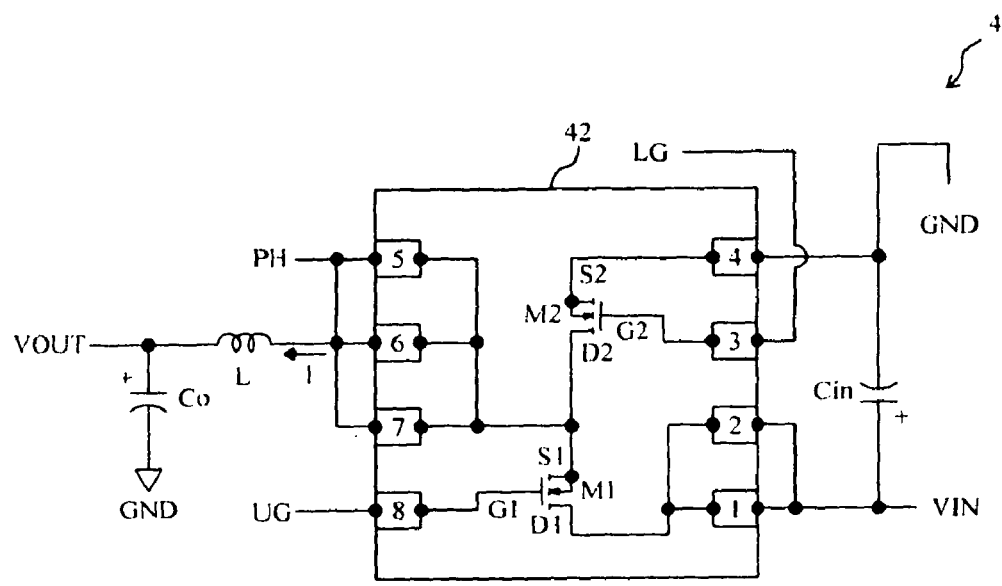
FIG. 5 shows a layout when a FairChild FD6900AS is used in a synchronous buck converter.
Figure 6:
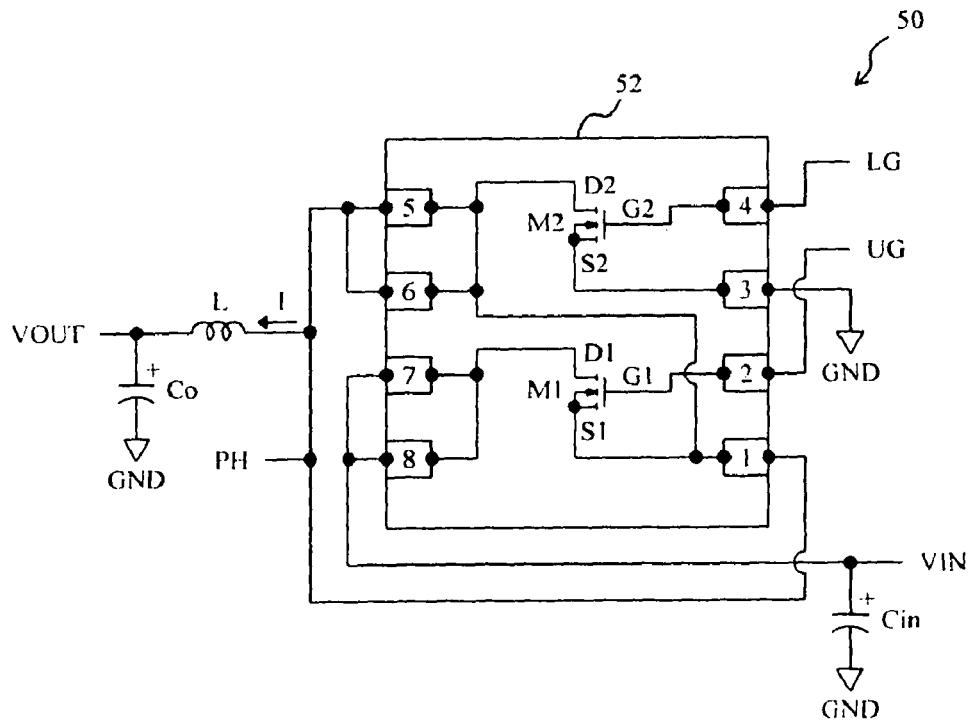
FIG. 6 shows a layout when a FairChild FD6986AS is used in a synchronous buck converter.
Figure 7:
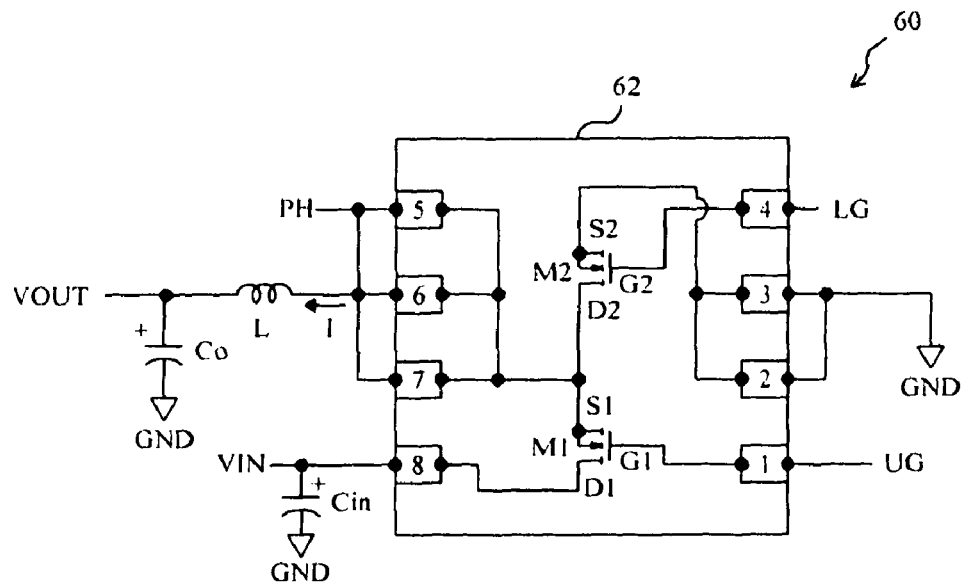
FIG. 7 shows a layout when an IRF7904 is used in a synchronous buck converter.
Figure 8:
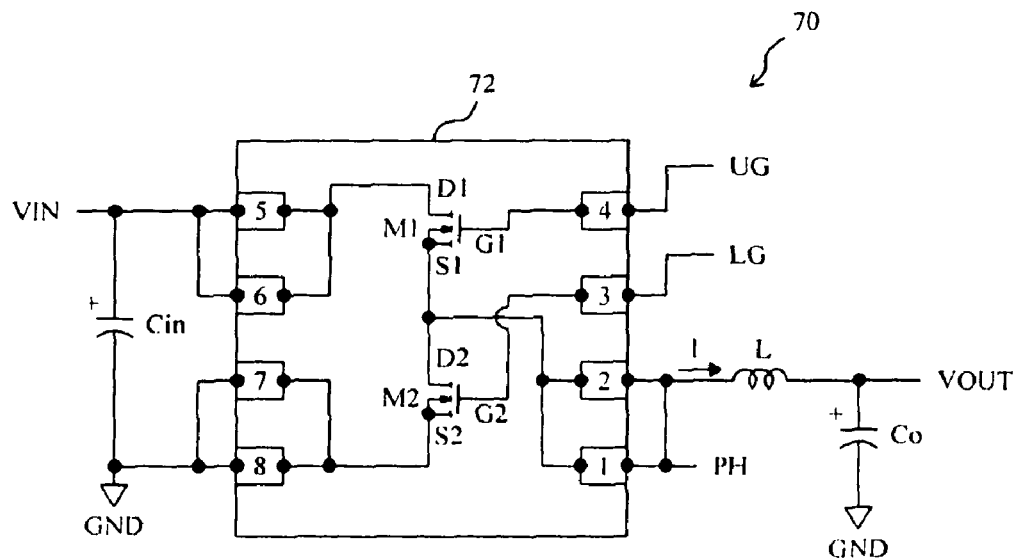
FIG. 8 shows a layout when a dual SO-8 MOSFET package according to the present invention is used in a synchronous buck converter.

FIG. 8 shows a layout when a dual SO-8 MOSFET package according to the present invention is used in a synchronous buck converter. In a package 70, a drain D1 of a transistor M1 is connected with a power input VIN via the pins 5 and 6, a source S1 of the transistor M1 is connected to the inductor L and phase node PH via the pins 1 and 2 respectively, a gate G1 of the transistor M1 is connected with the control signal UG via the pin 4, a connection between a drain D2 of a transistor M2 and the source S1 of the transistor M1 is within the package 70, a source S2 of the transistor M2 is grounded via the pins 7 and 8, a gate G2 of the transistor M2 is connected with the control signal LG via the pin 3, and a plastic body 72 encapsulates the transistors M1 and M2. As shown in the layout of FIG. 8, there is no wire needed to be across over any other, and therefore the package 70 is more convenient for the layout. Because the pins 5 and 6 which are both connected to the drain D1 of the transistor M1 and the pins 7 and 8 which are connected to the source S2 of the transistor M2 are arranged on a same side of the package, the decoupling problem of the input capacitor Cin that is introduced by the traditional package is avoided. In other embodiment, the connection relationship between the pins and the terminals D1, D2, S1, S2, G1 and G2 can be optionally changed if it doesn't violent a rule that the pins which are connected to the drain D1 and the pins which are connected to the source S2 are on one side of the package 70, and the pins which are connected to the source S1, the pins which are connected to the drain D2, and the pins which are connected to the gates G1 and G2 are on another side of the package 70.

Figure 9:
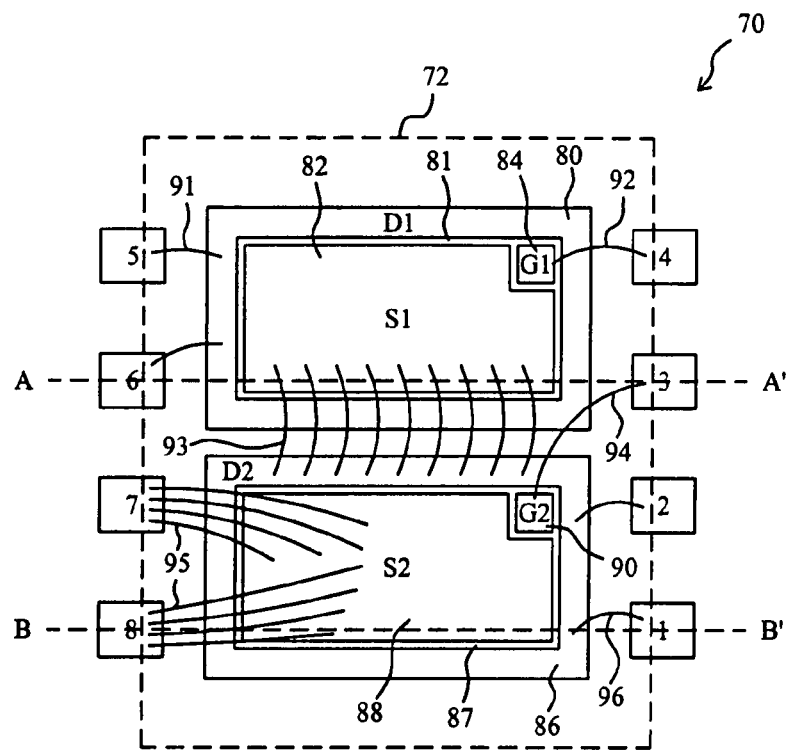
FIG. 9 shows a top view of a first embodiment of the package shown in FIG. 8.
Figure 10:
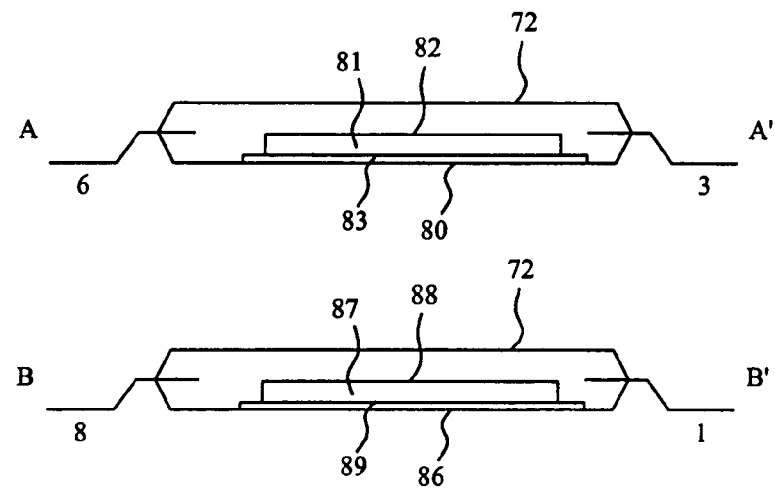
FIG. 10 shows two cross-sectional views from AA' and BB' designated in FIG. 9.

FIG. 9 shows a top view of a first embodiment of the package 70, and FIG. 10 shows two cross-sectional views from AA' and BB' designated in FIG. 9, in which a semiconductor die 81 includes the transistor M1, and a semiconductor die 87 includes the transistor M2. The semiconductor die 81 has a source region 82 and a gate region 84 on the top surface and a drain region 83 on the bottom surface, and the drain region 83 is attached on a leadframe 80. The semiconductor die 87 has a source region 88 and a gate region 90 on the top surface and a drain region 89 on the bottom surface, and the drain region 89 is attached on a leadframe 86. The leadframes 80 and 86 are insulated from each other. Bonding wires 91 are used to electrically connect the leadframe 80 to the pins 5 and 6, a bonding wire 92 is used to electrically connect the gate region 84 to the pin 4, bonding wires 93 are used to electrically connect the source region 82 to the leadframe 86, a bonding wire 94 is used to electrically connect the gate region 90 to the pin 3, bonding wires 95 are used to electrically connect the source region 88 to the pins 7 and 8, and bonding wires 96 are used to electrically connect the leadframe 86 to the pins 1 and 2. In this embodiment, each of the leadframes 80 and 86 has a surface in the bottom exposed to outside of the package 70.

Figure 11:
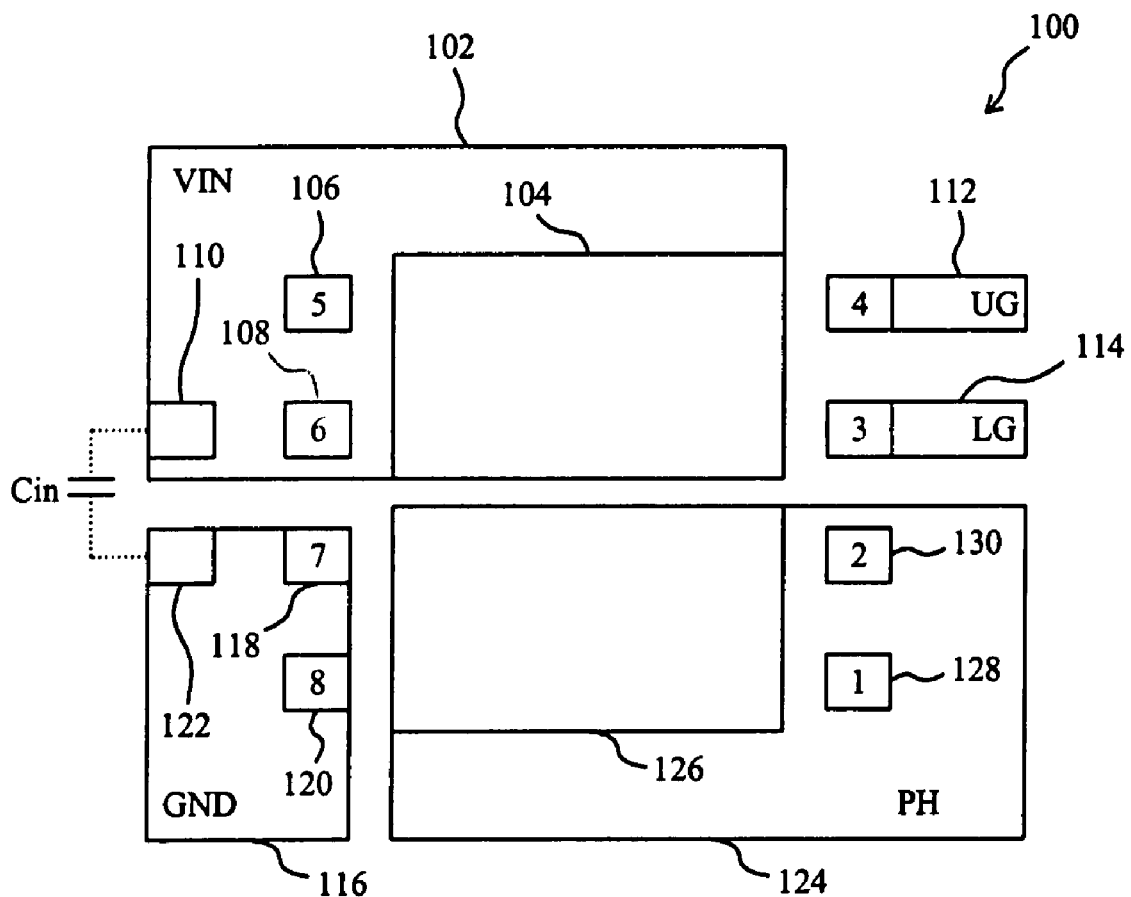
FIG. 11 shows a layout on a printed circuit board to be mounted thereon with a package according to the present invention.

FIG. 11 shows a layout on a printed circuit board 100 to be mounted thereon with the package 70 of FIGS. 9 and 10. Since the pins 5 and 6 are both connected to the drain region 83 of the semiconductor die 81, and the ledframe 80 attached to the drain region 83 has an exposed surface in the bottom of the package 70, the PCB 100 may provide a larger metal plate 102 for the leadframe 80 and the pins 5 and 6 to connect with the input voltage VIN. In the metal plate 102, a region 104 is configured to be bounded with the leadframe 80, a region 106 is configured to be bounded with the pin 5, and a region 108 is configured to be bounded with the pin 6. Similarly, since the pins 1 and 2 are connected to the drain region 89 of the semiconductor die 87, and the leadframe 86 attached to the drain region 89 has an exposed surface in the bottom of the package 70, the PCB 100 may provide a larger metal plate 124 for the leadframe 86 and the pins 1 and 2 to connect to the phase node PH. In the metal plate 124, a region 126 is configured to be bounded with the leadframe 86, a region 128 is configured to be bounded with the pin 1, and a region 130 is configured to be bounded with the pin 2. On the other hand, since the source region 88 of the semiconductor die 87 is connected to the pins 7 and 8, the PCB 100 may provide a metal plate 116 serving as a ground metal plate GND for the pins 7 and 8 to be bounded thereon. In the metal plate 116, a region 118 is configured to be bounded with the pin 7, and a region 120 is configured to be bounded with the pin 8. The input capacitor Cin is connected between a region 110 on the metal plate 102 and a region 122 on the metal plate 116. Wires 112 and 114 are used for the control signals UG and LG to connect to the pins 4 and 3, respectively.

In this embodiment, since the leadframe 80 has an exposed surface in the bottom to connect to the metal plate 102 on the PCB 100, the heat on the drain region 83 can quickly transfer to the PCB 100. Similarly, since the leadframe 86 has an exposed surface in the bottom of the package 70 to connect to the metal plate 124 on the PCB 100, the heat on the drain region 89 can quickly transfer to the PCB 100. As a result, the dual MOSFET package 70 has better thermal dissipation than ever arts, and it can apply to a device that needs a large inductor current I.

Figure 12:
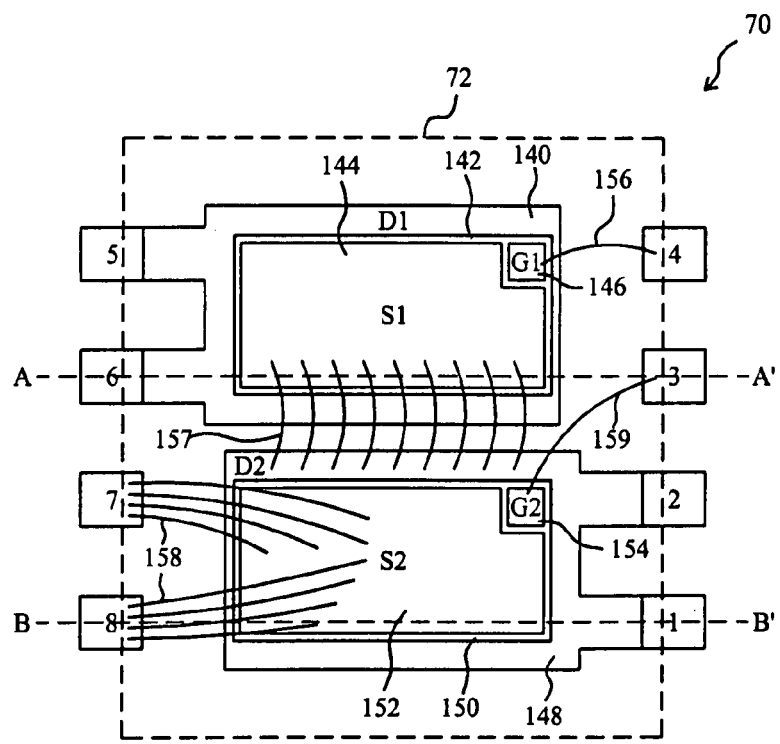
FIG. 12 shows a top view of a second embodiment of the package shown in FIG. 8.
Figure 13:
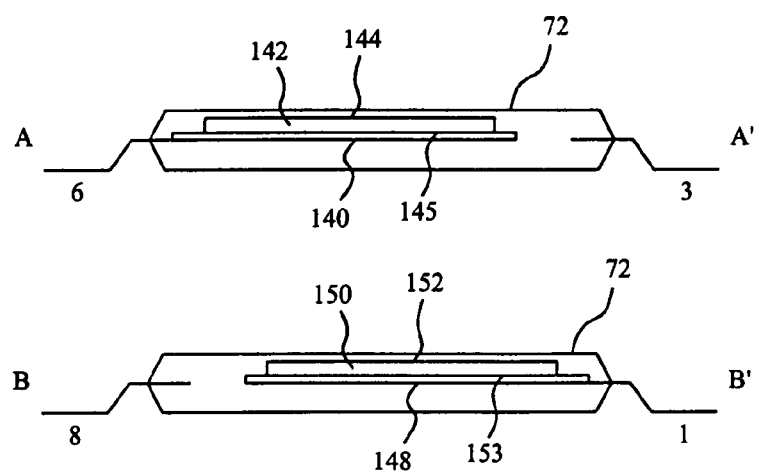
FIG. 13 shown two cross-sectional views from AA' and BB' designated in FIG. 12.

FIG. 12 shows a top view of a second embodiment of the package 70 shown in FIG. 8, and FIG. 13 shows two cross-sectional views from AA' and BB' designated in FIG. 12. A semiconductor die 142 includes the transistor M1, which has a source region 144 and a gate region 146 on the top surface and a drain region 145 on the bottom surface. A semiconductor die 150 includes the transistor M2, which has a source region 152 and a gate region 154 on the top surface and a drain region 153 on the bottom surface. The drain region 145 of the semiconductor die 142 is attached on a leadframe 140, and the drain region 153 of the semiconductor die 150 is attached on a leadframe 148. The pins 1 and 2 are stretched from the leadframe 148, and the pins 5 and 6 are ones stretched from the leadframe 140. A bonding wire 156 is used to connect the gate region 146 to the pin 4, bonding wires 157 are used to connect the source region 144 to the leadframe 148, bonding wires 158 are used to connect the source region 152 to the pins 7 and 8, and a bonding wire 159 is used to connect the gate region 154 to the pin 3. In this embodiment, the leadframe 140 has a portion stretched to serve as the pins 5 and 6, and therefore the heat on the drain region 145 of the semiconductor die 142 can rapidly transfer to the pins 5 and 6 and then dissipate to the PCB. Similarly, the leadframe 148 has a portion stretched to serve as the pins 1 and 2, such that the heat on the drain region 153 of the semiconductor die 150 can rapidly transfer to the pins 1 and 2 and then dissipate to the PCB. Therefore, this embodiment package has better thermal dissipation.

Figure 14:
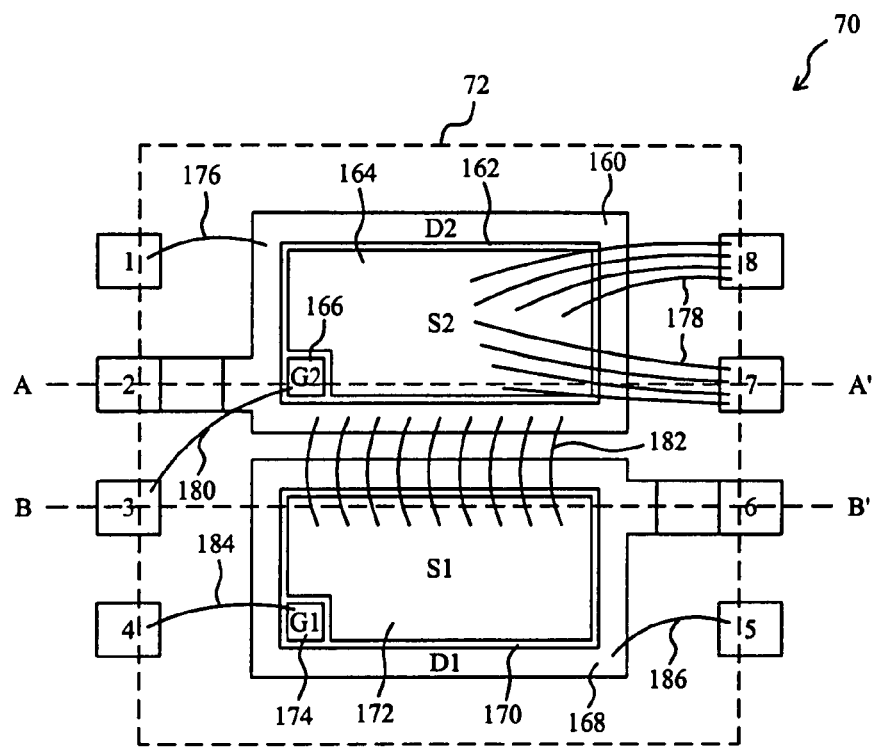
FIG. 14 shows a top view of a third embodiment of the package shown in FIG. 8.
Figure 15:
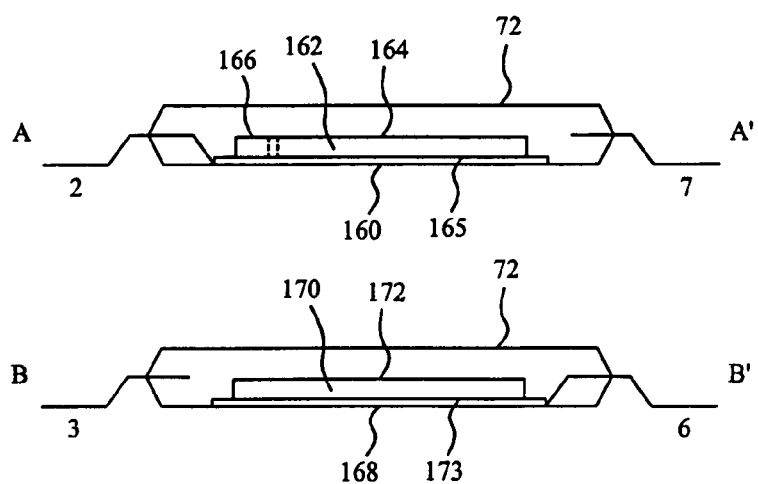
FIG. 15 shows two cross-sectional views from AA' and BB' designated in FIG. 14.

FIG. 14 shows a top view of a third embodiment of the package 70 shown in FIG. 8, and FIG. 15 shows two cross-sectional views from AA' and BB' designated in FIG. 14. A semiconductor die 162 includes the transistor M1, which has a source region 164 and a gate region 166 on the top surface and a drain region 165 on the bottom surface, and a semiconductor die 170 includes the transistor M2, which has a source region 172 and a gate region 174 on the top surface and a drain region 173 on the bottom surface. The drain region 165 of the semiconductor die 162 is attached on a leadframe 160, and the drain region 173 of the semiconductor die 170 is attached on a leadframe 168. The pin 2 is stretched from the leadframe 160, and the pin 6 is stretched from the leadframe 168. A bonding wire 176 is used to connect the leadframe 160 to the pin 1, bonding wires 178 are used to connect the source region 164 to the pins 7 and 8, a bonding wire 180 is used to connect the source region 172 to the ledframe 160, a bonding wire 184 is used to connect the gate region 174 to the pin4, and a bonding wire 186 is used to connect the leadframe 168 to the pin 5. In this embodiment, the leadframe 160 has a surface in the bottom exposed to outside of the package 70 to connect to the metal plate 124 on the PCB 100 of FIG. 11, and the leadframe 168 has a surface in the bottom exposed to outside of the package 70 to connect to the metal plate 102 on the PCB 100. Therefore, the heat on the drain regions 165 and 173 can rapidly transfer to the PCB 100. Further, since the pins 2 and 6 are stretched from the leadframes 160 and 168 respectively, the heat on the drain regions 165 and 173 also can transfer to the PCB 100 via the pins 2 and 6. Therefore, this embodiment package has better thermal dissipation. In other embodiments, the leadframes 160 and 168 also can have a portion stretched to serve as the pins 1 and 5 respectively.

Figure 16:
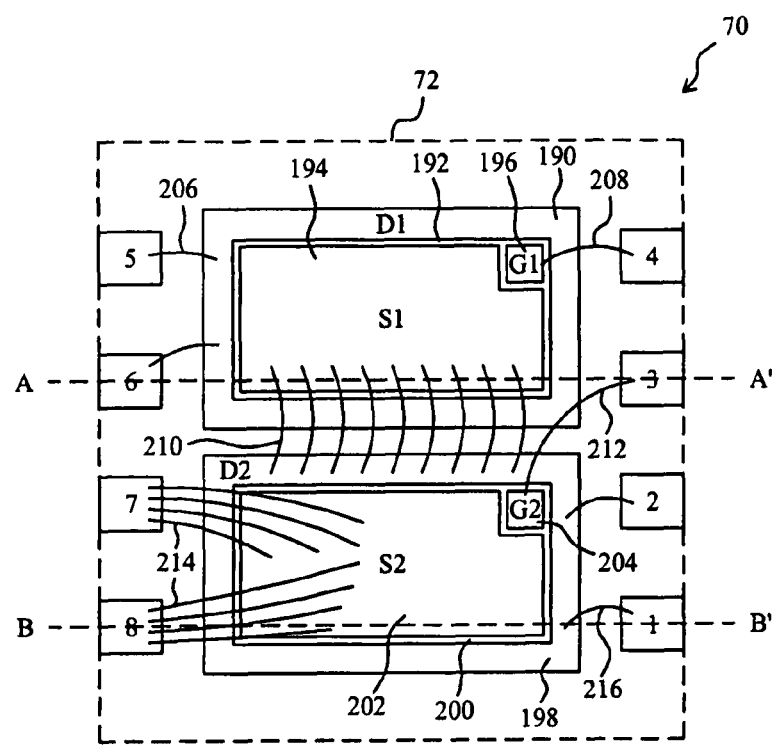
FIG. 16 shows a top view of a fourth embodiment of the package shown in FIG. 8.
Figure 17:
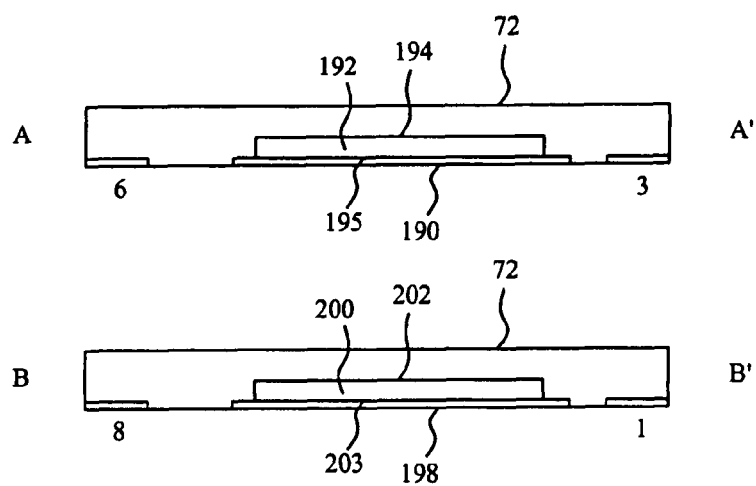
FIG. 17 shows two cross-sectional views from AA' and BB' designated in FIG. 16.

FIG. 16 shows a top view of a fourth embodiment of the package 70 shown in FIG. 8, and FIG. 17 shown two cross-sectional views from AA' and BB' shown in FIG. 16. The semiconductor die 192 includes the transistor M1, which has a source region 194 and a gate region 196 on the top surface and a drain region 195 on the bottom surface, and the semiconductor die 200 includes the transistor M2, which has a source region 202 and a gate region 204 on the top surface and a drain region 203 on the bottom surface. The drain region 195 of the semiconductor die 192 is attached on a leadframe 190, and the drain region 203 of the semiconductor die 200 is attached on a leadframe 198. The leadframes 190 and 196 are insulated from each other. Bonding wires 206 are used to connect the leadframe 190 to the pins 5 and 6, a bonding wire 208 is used to connect the gate region 196 to the pin 4, bonding wires 210 are used to connect the source region 194 to the leadframe 198, a bonding wire 212 is used to connect the gate region 204 to the pin 3, bonding wires 214 are used to connect the source region 202 to the pins 7 and 8, and bonding wires 216 are used to connect the leadframe 196 to the pins 1 and 2. In this embodiment, each of the leadframes 190 and 196 has a surface in the bottom to expose to outside of the package 70. This embodiment package is a Quad Flat No Lead (QFNL) package whose pins 1-8 are all not protruded outside the package.

Figure 18:
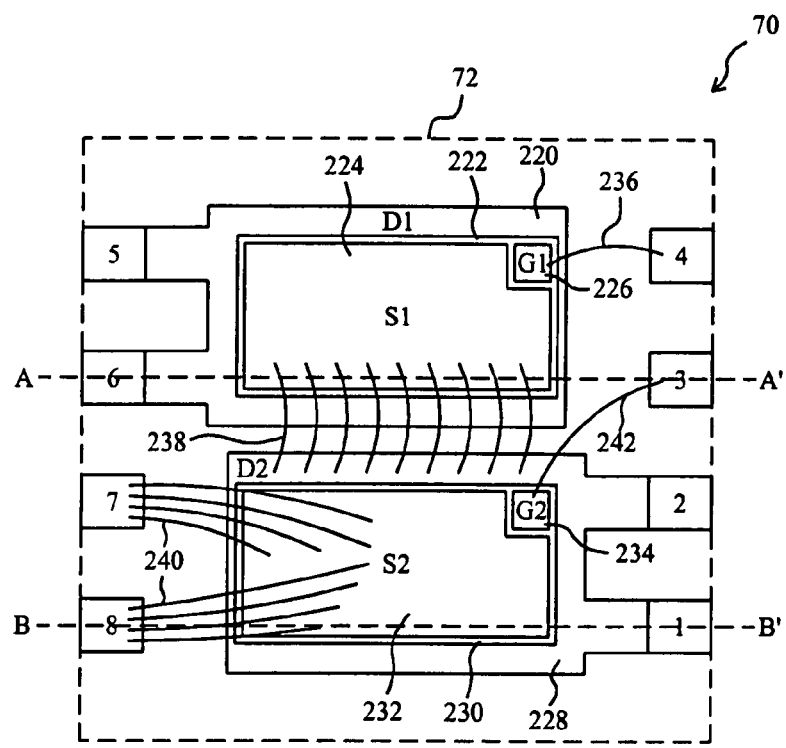
FIG. 18 shows a top view of a fifth embodiment of the package shown in FIG. 8.
Figure 19:
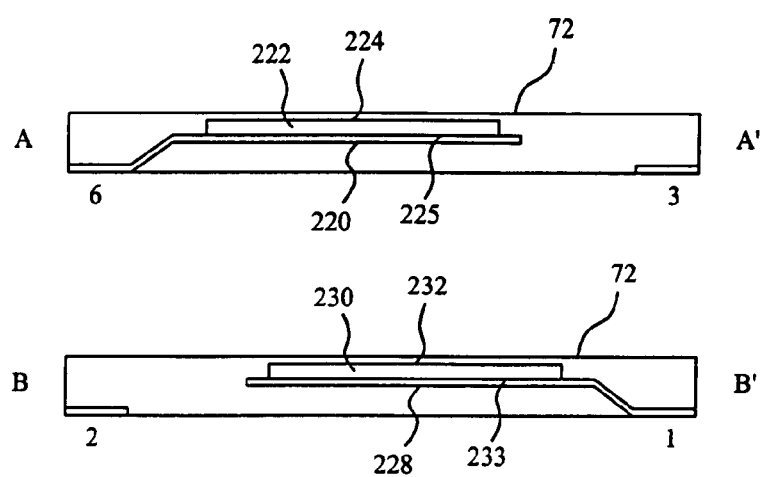
FIG. 19 shows two cross-sectional views from AA' and BB' designated in FIG. 18.

FIG. 18 shows a top view of a fifth embodiment of the package 70 shown in FIG. 8, and FIG. 19 shows two cross-sectional views from AA' and BB' designated in FIG. 18. A semiconductor die 222 includes the transistor M1, which has a source region 224 and a gate region 226 on the top surface and a drain region 225 on the bottom surface, and a semiconductor die 230 includes the transistor M2, which has a source region 232 and a gate region 234 on the top surface and a drain region 233 on the bottom surface. The drain region 225 of the semiconductor die 222 is attached on a leadframe 220, and the drain 233 of the semiconductor die 230 is attached on a leadframe 228. The pins 1 and 2 are stretched from the leadframe 228, and the pins 5 and 6 are stretched from the leadframe 220. A bonding wire 236 is used to connect the gate region 226 to the pin 4, bonding wires 238 are used to connect the source region 224 to the leadframe 228, bonding wires 240 are used to connect the source region 232 to the pins 7 and 8, a bonding wire 242 is used to connect the gate region 234 to the pin 3. This embodiment package is a Quad Flat No Lead (QNFL) package whose pins 1-8 are all not protruded outside the package. Since the leadframe 220 has a portion stretched to serve as the pins 5 and 6, the heat on the drain region 225 of the semiconductor die 222 can rapidly transfer to the pins 5 and 6 and then dissipate to the PCB. Also, the heat on the drain region 233 of the semiconductor die 230 can rapidly transfer to the PCB via the pins 1 and 2 since the pins 1 and 2 are a portion of the leadframe 228.

Figure 20:
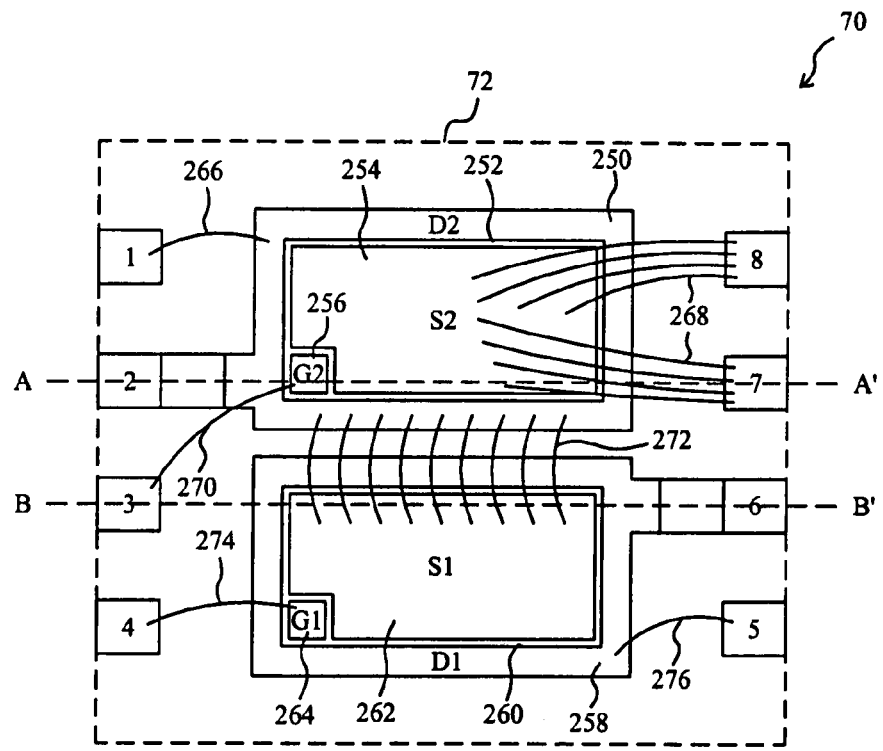
FIG. 20 shows a top view of a sixth embodiment of the package shown in FIG. 8.
Figure 21:
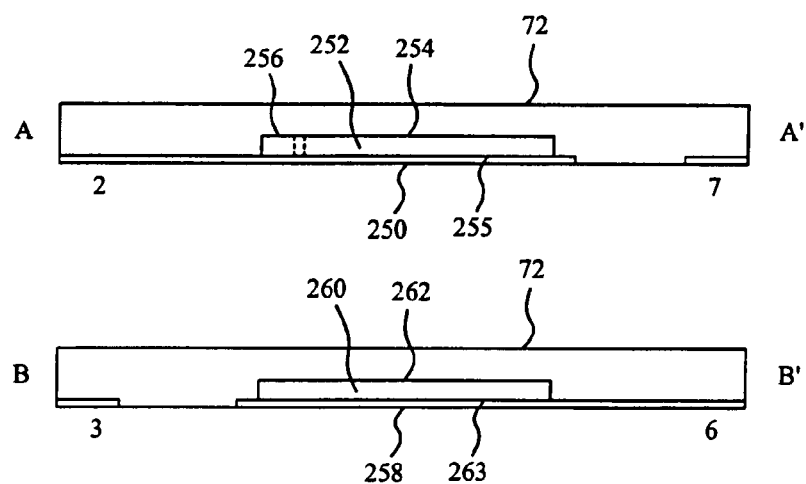
FIG. 21 shows two cross-sectional views from AA' and BB' designated in FIG. 20.

FIG. 20 shows a top view of a sixth embodiment of the package 70 shown in FIG. 8, and FIG. 21 shows two cross-sectional views from AA' and BB' designated in FIG. 20. A semiconductor die 252 includes the transistor M1, which has a source region 254 and a gate region 256 on the top surface and a drain region 255 on the bottom surface. A semiconductor die 260 includes the transistor M2, which has a source region 262 and a gate region 264 on the top surface and a drain region 263 on the bottom surface. The drain region 255 of the semiconductor die 252 is attached on the leadframe 250, and the drain region 263 of the semiconductor die 260 is attached on the leadframe 258. The pin 2 is stretched from the leadframe 250, and the pin 6 is stretched from the ledframe 258. A bonding wire 266 is used to connect the leadframe 250 to the pin 1, bonding wires 268 are used to connect the source region 254 to the pins 7 and 8, a bonding wire 270 is used to connect the gate region 256 to the pin 3, bonding wires 272 are used to connect the source region 262 to the leadframe 250, a bonding wire 274 is used to connect the gate region 264 to the pin 4, and a bonding wire 276 is used to connect the leadframe 258 to the pin 5. This embodiment package is a Quad Flat No Lead (WFNL) package whose pins 1-8 are all not protruded outside the package. Since each of the leadframes 250 and 258 has a surface in the bottom exposed to outside of the package 70 to respectively connect to the metal plates 124 and 102 on the PCB 100 shown in FIG. 11, the heat on the drain regions 255 and 263 can rapidly transfer to the PCB 100. Since the pins 2 and 6 are stretched from the leadframes 250 and 258, respectively, the heat on the drain regions 255 and 263 also can rapidly transfer to the PCB 100 via the pins 2 and 6. In other embodiments, the pins 1 and 5 also can be stretched from the leadframes 250 and 258, respectively.

Figure 22:
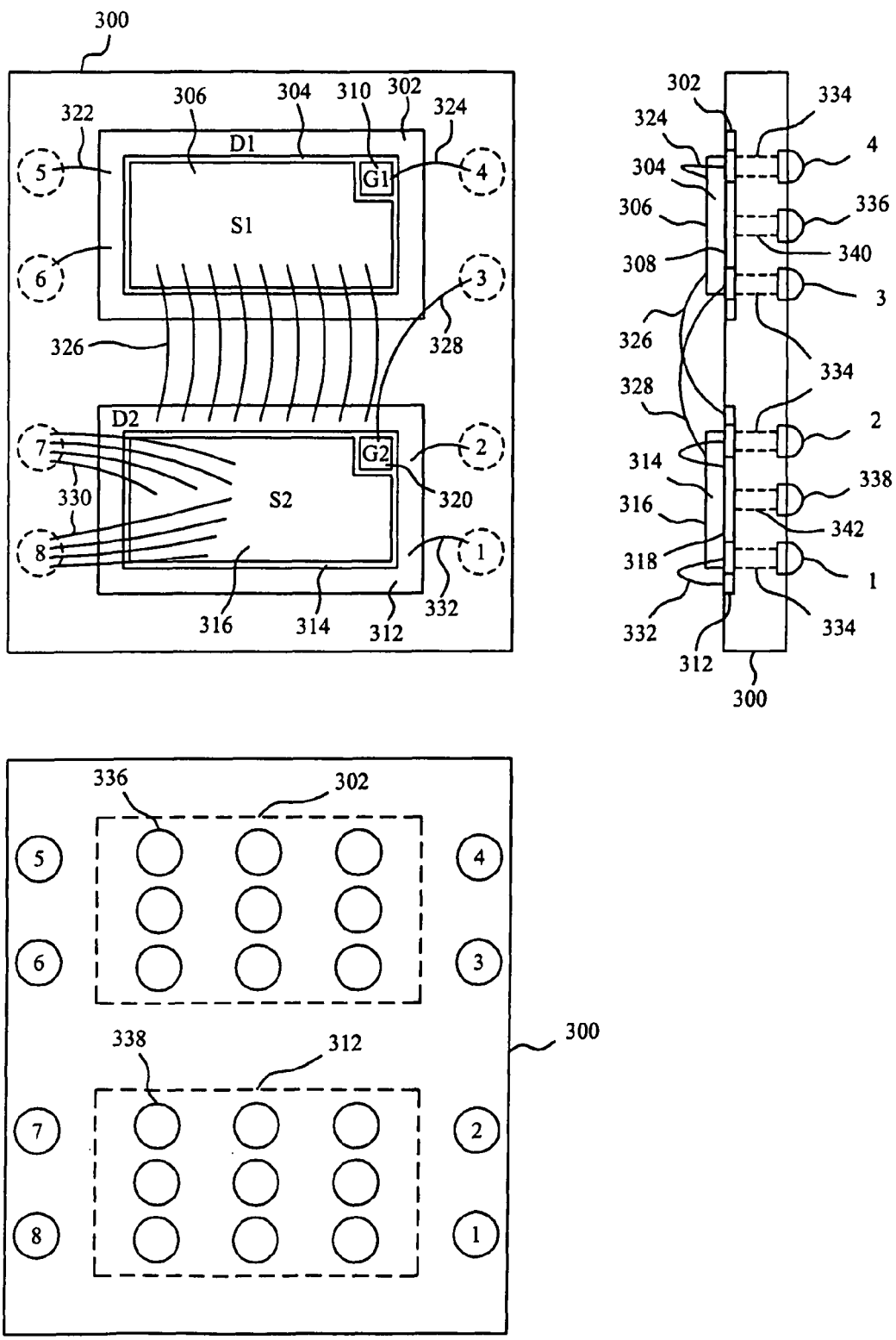
FIG. 22 shows an embodiment of a Ball Grid Array (BGA) package according to the present invention.

FIG. 22 shows an embodiment of a Ball Grid Array (BGA) package according to the present invention, in which a semiconductor die 304 including the transistor M1 is attached to a metal plate 302 on a package substrate 300, and has a source region 306 and a gate region 210 on the top surface and a drain region 308 on a bottom surface and attached on the metal plate 302, a semiconductor die 314 including the transistor M2 is attached to a metal plate 312 on the package substrate 300, and has a source region 316 and a gate region 320 on the top surface and a drain region 318 on the bottom surface and attached on the metal plate 312, bonding wires 322 are used to connect the metal plate 302 to the solder balls which serve as the pins 5 and 6, a bonding wire 324 is used to connect the gate region 310 to the solder ball which serves as the pin 4, bonding wires 326 are used to connect the source region 306 to the metal plate 312, a bonding wire 328 is used to connect the gate region 320 to the solder ball which serves as the pin 3, bonding wires 330 are used to connect the source region 316 to the solder balls which serve as the pins 7 and 8, and bonding wires 332 are used to connect the metal plate 312 to the solder balls which serve as the pins 1 and 2. The solder balls 1-8 are on the bottom surface of the package substrate 300, and the bonding wires 322-332 are connected to the solder balls 1-8 by the vias 334. On the bottom surface of the package substrate 300, more solder balls 336 and 338 which are connected to the metal plate 302 and 312 are soldered to a thermal dissipation metal plate on the PCB. Thereby, the heat on the drain regions 308 and 318 can quickly dissipate to the PCB.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A semiconductor device package having a first side, a second side, a third side, and a fourth side, the semiconductor device package comprising:
    a first leadframe;
    a first semiconductor die having a first drain region attached on the first leadframe, a first source region, and a first gate region;
    a second leadframe electrically insulated from the first leadframe and electrically connected to the first source region;
    a second semiconductor die having a second drain region attached on the second leadframe, a second source region, and a second gate region;
    a first pin bonded directly to the first leadframe;
    a second pin bonded directly to the first gate region;
    a third pin bonded directly to the second leadframe;
    a fourth pin bonded directly to the second source region; and
    a fifth pin bonded directly to the second gate region;
    wherein the first and fourth pins are on the first side of the semiconductor device package, and the second, third and fifth pins are on the second side of the semiconductor device package.

2. The semiconductor device package of claim 1, wherein each of the first and second leadframe has a surface exposed to outside of the semiconductor device package.

3. The semiconductor device package of claim 1, wherein the second leadframe is electrically connected to the first source region by a bonding wire.

4. The semiconductor device package of claim 1, wherein the first pin is bonded directly to the first leadframe by a bonding wire.

5. The semiconductor device package of claim 1, wherein the first pin is stretched from the first leadframe.

6. The semiconductor device package of claim 1, wherein the second pin is bonded directly to the first gate region by a bonding wire.

7. The semiconductor device package of claim 1, wherein the third pin is bonded directly to the second leadframe by a bonding wire.

8. The semiconductor device package of claim 1, wherein the third pin is stretched from the second leadframe.

9. The semiconductor device package of claim 1, wherein the fourth pin is bonded directly to the second source region by a bonding wire.

10. The semiconductor device package of claim 1, wherein the fifth pin is bonded directly to the second gate region by a bonding wire.

11. A semiconductor device package having a first side, a second side, a third side, and a fourth side, the semiconductor device package comprising:
   a package substrate having a first surface and a second surface;
   a first metal plate on the first surface of the package substrate which is contiguous a printed circuit board for dissipation of heat;
   a first semiconductor die having a first drain region attached on the first metal plate, a first source region, and a first gate region;
   a second metal plate on the first surface of the package substrate which is contiguous the printed circuit board for dissipation of heat, electrically insulated from the first metal plate, and electrically connected to the first source region;
   a second semiconductor die having a second drain region attached on the second metal plate, a second source region, and a second gate region;
   a first pin on the second surface of the package substrate and bonded directly to the first metal plate;
   a second pin on the second surface of the package substrate and bonded directly to the first gate region;
   a third pin on the second surface of the package substrate and bonded directly to the second metal plate;
   a fourth pin on the second surface of the package substrate and bonded directly to the second source region; and
   a fifth pin on the second surface of the package substrate and bonded directly to the second gate region;
   wherein the first and fourth pins are on the first side of the semiconductor device package, and the second, third, and fifth pins are on the second side of the semiconductor device package.

12. The semiconductor device package of claim 11, further comprising:
   a plurality of first metal balls on the second surface of the package substrate and electrically connected to the first metal plate; and
   a plurality of second metal balls on the second surface of the package substrate and electrically connected to the second metal plate.

13. The semiconductor device package of claim 11, wherein the second metal plate is electrically connected to the first source region by a bonding wire.

14. The semiconductor device package of claim 11, wherein the first pin is bonded directly to the first metal plate by a bonding wire.

15. The semiconductor device package of claim 11, wherein the second pin is bonded directly to the first gate region by a bonding wire.

16. The semiconductor device package of claim 11, wherein the third pin is bonded directly to the second metal plate by a bonding wire.

17. The semiconductor device package of claim 11, wherein the fourth pin is bonded directly to the second source region by a bonding wire.

18. The semiconductor device package of claim 11, wherein the fifth pin is bonded directly to the second gate region by a bonding wire.

* * * * *